United States Patent
Chen

(10) Patent No.: US 8,009,258 B2
(45) Date of Patent: Aug. 30, 2011

(54) DISPLAY PANEL, METHOD OF INSPECTING LEAD BONDING OF DISPLAY PANEL, AND LEAD BONDING METHOD OF DISPLAY PANEL

(75) Inventor: Yung-Chien Chen, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 988 days.

(21) Appl. No.: 11/773,969

(22) Filed: Jul. 6, 2007

(65) Prior Publication Data

US 2008/0223501 A1 Sep. 18, 2008

(30) Foreign Application Priority Data

Mar. 15, 2007 (TW) ................................ 96108920 A

(51) Int. Cl.
*G02F 1/1345* (2006.01)
(52) U.S. Cl. ...................... 349/149; 349/151; 349/152
(58) Field of Classification Search ........... 349/149–152
See application file for complete search history.

(56) References Cited

U.S. PATENT DOCUMENTS

| | | | |
|---|---|---|---|
| 2002/0097366 A1* | 7/2002 | Moon | 349/149 |
| 2003/0160929 A1* | 8/2003 | Kurasawa | 349/149 |

* cited by examiner

*Primary Examiner* — David Nelms
*Assistant Examiner* — David Y Chung
(74) *Attorney, Agent, or Firm* — Jianq Chyun IP Office

(57) ABSTRACT

A display panel including a substrate and a plurality of films for carrying chips is provided. The substrate has a display region and a non-display region located at one side of the display region. The non-display region has a plurality of pad regions, and each pad region has a plurality of first leads and at least one first displacement measuring mark disposed therein. The first displacement measuring mark is located at at least one side of all the first leads. The films for carrying chips are correspondingly sticking on the substrate. Each film for carrying chips has a plurality of second leads and at least one second displacement measuring mark. The second displacement measuring mark is located at least one side of all the second leads and is corresponding to the first displacement measuring mark. The second leads are correspondingly connected with the first leads.

4 Claims, 3 Drawing Sheets

DISPLAY PANEL, METHOD OF INSPECTING LEAD BONDING OF DISPLAY PANEL, AND LEAD BONDING METHOD OF DISPLAY PANEL

CROSS-REFERENCE TO RELATED APPLICATION

This application claims the priority benefit of Taiwan application serial no. 96108920, filed Mar. 15, 2007. All disclosure of the Taiwan application is incorporated herein by reference.

BACKGROUND OF THE INVENTION

1. Field of the Invention

The present invention relates to a display panel. More particularly, the present invention relates to a display panel that allows easy inspection of an offset amount of bonded leads, a method of inspecting lead bonding of the display panel, and a lead bonding method of the display panel.

2. Description of Related Art

A flat panel display includes a display panel, a light source for providing sufficient brightness for the display panel, and drive chips disposed on a substrate of the display panel. The drive chip is used to drive circuits inside the display panel, so that the display panel can display an image.

FIG. 1A is a schematic view of a conventional display panel, and FIG. 1B is a partial enlarged view of FIG. 1A. Referring to FIGS. 1A and 1B, in the display panel 100, a plurality of leads 122 are disposed respectively in a plurality of pad regions 120 located in a non-display region 110a of the substrate 110. The leads 122 are located in a non-display region 110a of the substrate 110. The leads 122 are correspondingly connected to the leads 132 of the drive chip 130.

However, due to the material characteristics of the leads 122 and 132, when the leads 132 of the drive chip are hot pressed with the leads 122 in the pad regions 120, the leads 122 will expand in the shape according to the different disposal positions in the pad regions 120, and thus the quality of lead bonding is unstable. This problem usually influences the bonding yield of the leads 132 of the drive chip 130 and the leads 122 in the pad regions 120. If the bonding yield of the leads 132 of the drive chip 130 and the leads 122 on the substrate 110 is low, the displaying quality of the display panel 100 will be affected. Furthermore, the display panel 100 will need to be refabricated, and this wastes manpower and reworking hours. That's why the manufacturing cost of the display panel 100 cannot be effectively reduced.

SUMMARY OF THE INVENTION

The present invention provides a display panel, in which the yield of leads bonding can be recognized easily.

The present invention provides a method for inspecting lead bonding of the display panel, so as to recognize the yield of leads bonding easily.

The present invention provides a method for bonding leads of the display panel, so as to enhance the yield of lead bonding of the display panel.

The display panel provided by the present invention includes a substrate and a plurality of films for carrying chips. The substrate has a display region and a non-display region at one side of the display region. The non-display region has a plurality of pad regions, and each pad region has a plurality of first leads and at least one first displacement measuring mark. The first displacement measuring mark is located at least one side of all the first leads. The films for carrying chips are correspondingly sticking on the substrate. Each film for carrying chips has second leads and a second displacement measuring mark. The second displacement measuring mark is located at least one side of all the second leads, and is corresponding to the first displacement measuring mark. The second leads are correspondingly connected to the first leads.

In an embodiment of the present invention, the first displacement measuring mark is a counting scale, and the second displacement measuring mark is an index mark.

In an embodiment of the present invention, the first displacement measuring mark is an index mark, and the second displacement measuring mark is a counting scale.

The method of inspecting lead bonding of a display panel provided by the present invention includes firstly providing a substrate. A plurality of first leads and at least one first displacement measuring mark located at least one side of all the first leads are disposed in a plurality of pad regions in a non-display region of the substrate, respectively. Then, a plurality of films for carrying chips is provided. Each film for carrying chips has a plurality of second leads and at least one second displacement measuring mark. At least one second displacement measuring mark is located at least one side of all the second leads, and the second displacement measuring mark is corresponding to the first displacement measuring mark. Subsequently, the corresponding first leads and second leads are pressed. Finally, the alignment offset amount of the second displacement measuring mark and the first displacement measuring mark is inspected.

In an embodiment of the present invention, the method of inspecting the alignment offset amount of the first and second displacement measuring marks includes visual estimation.

In an embodiment of the present invention, the method of inspecting lead bonding of a display panel further includes calculating an alignment offset amount, so as to define a carrying region in each pad region of the substrate.

A lead bonding method of a display panel includes firstly providing a substrate. A plurality of first leads and at least one first displacement measuring mark located at least one side of all the first leads are disposed in a plurality of pad regions in a non-display region of the substrate, respectively, and each pad region has a carrying region. Then, a plurality of films for carrying chips is provided. Each film for carrying chips has a plurality of second leads and at least one second displacement measuring mark. The second displacement measuring mark is located at least one side of all the second leads, and the second displacement measuring mark is corresponding to the first displacement measuring mark. Finally, the first leads and the corresponding second leads in the carrying region are pressed.

In an embodiment of the present invention, the carrying region is defined by calculating the alignment offset amount of the first displacement measuring mark and the second displacement measuring mark.

In the present invention, the bonding yield of the first leads and the second leads is inspected by using the displacement measuring marks of the pad regions of the substrate and the films for carrying chips, thereby saving manpower and inspection hours. Furthermore, according to the method of inspecting lead bonding of a display panel provided by the present invention, the alignment offset amount of the first displacement measuring mark is calculated to define a carrying region of the substrate. Subsequently, the first leads and the second leads in the carrying region are pressed, thereby saving cost and enhancing the bonding yield.

In order to the make aforementioned and other objects, features and advantages of the present invention comprehensible, a preferred embodiment accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
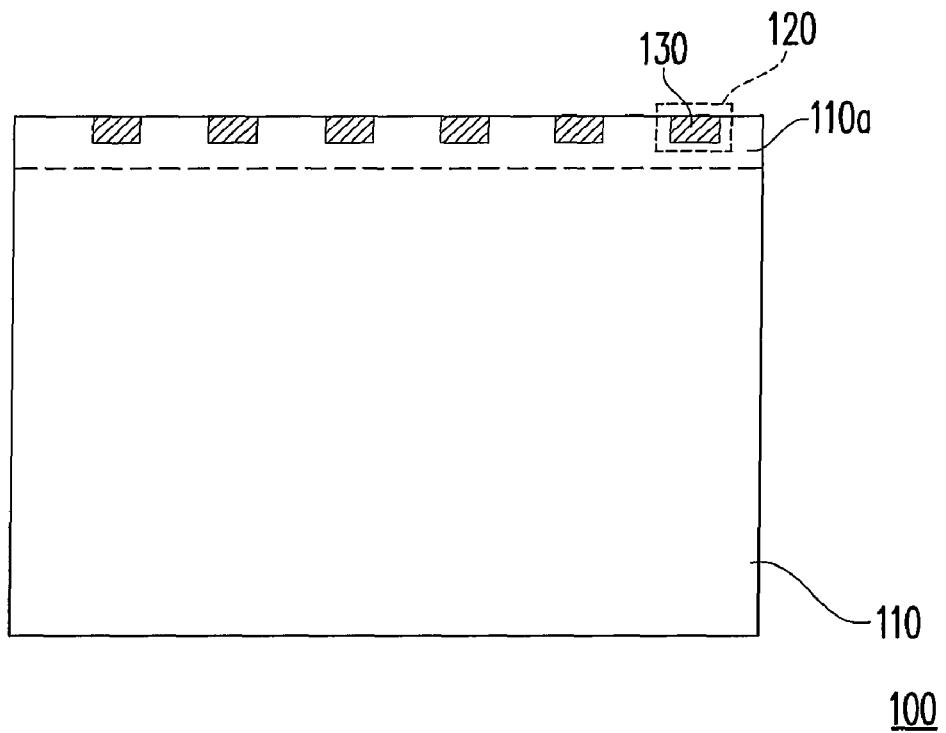
FIG. 1A is a schematic view of a conventional display panel.
Figure 1B:
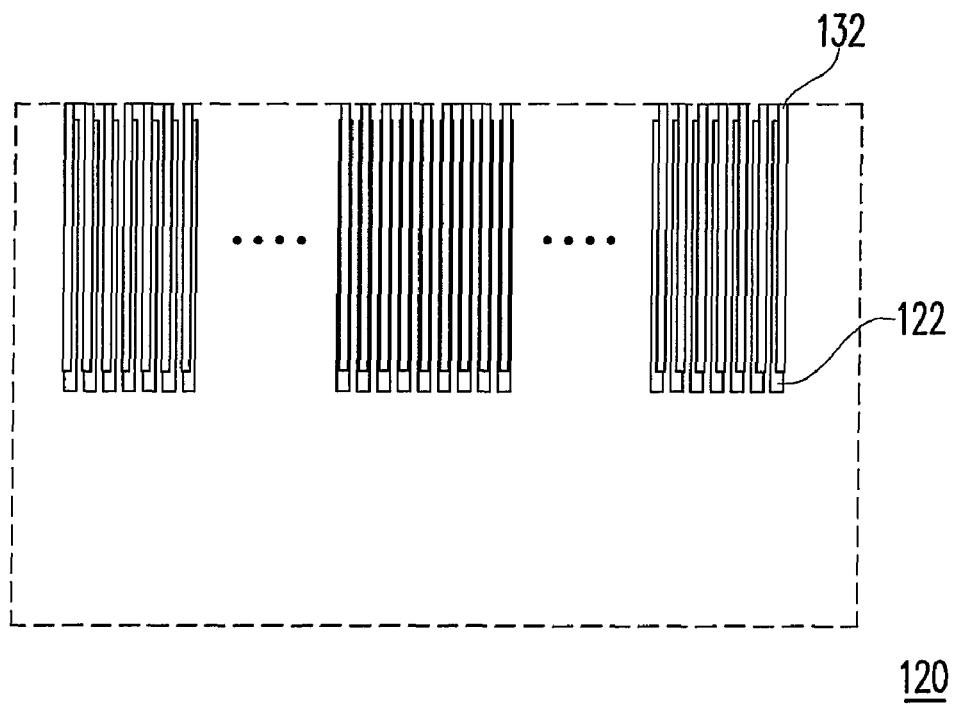
FIG. 1B is a partial enlarged view of FIG. 1A.
Figure 2A:
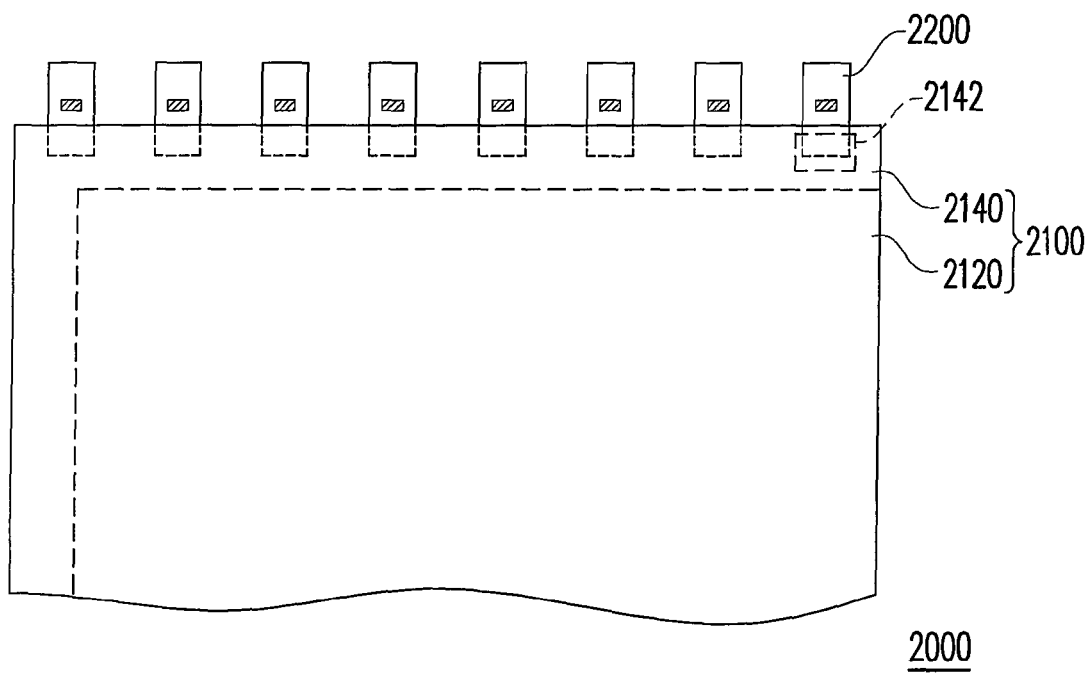
FIG. 2A is a schematic partial view of a display panel according to an embodiment of the present invention.

FIG. 2A is a partial enlarged view of the display panel according to an embodiment of the present invention. Referring to FIG. 2A, the display panel 2000 in this embodiment includes a substrate 2100 and a plurality of films for carrying chips 2200. The substrate 2100 has a display region 2120 and a non-display region 2140 at one side of the display region 2120. The non-display region 2140 has a plurality of pad regions 2142.

Figure 2B:
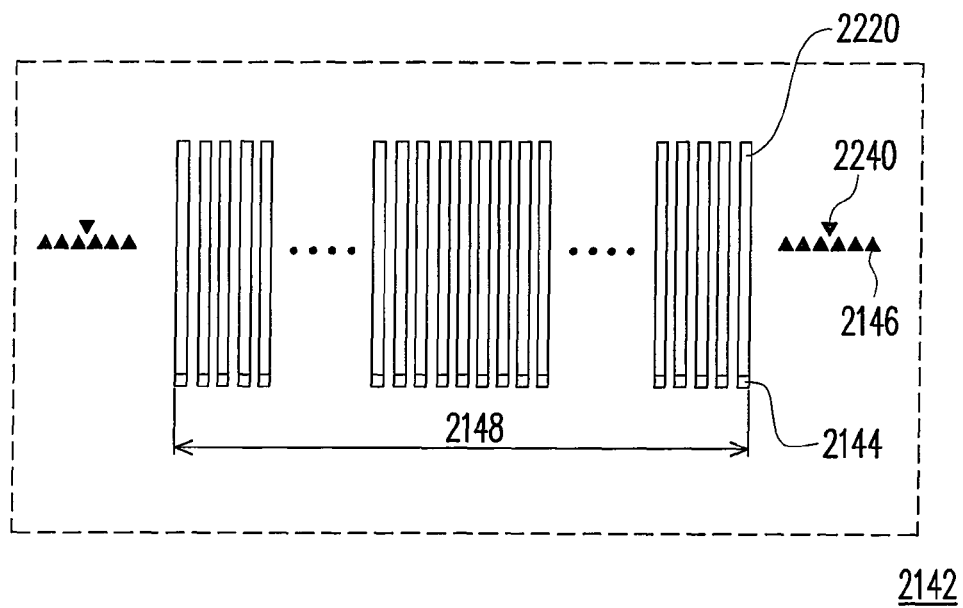
FIG. 2B is a schematic view of pad regions in FIG. 2A.

FIG. 2B is a schematic view of pad regions in FIG. 2A. Referring to FIGS. 2A and 2B together, each pad region 2142 has a plurality of first leads 2144 and at least one first displacement measuring mark 2146, and the first displacement measuring mark 2146 is disposed at one side of all the first leads 2144. The films 2200 for carrying chips are correspondingly sticking on the substrate 2100, and each film for carrying chips 2200 has a plurality of second leads 2220 and at least one second displacement measuring mark 2240.

Figure 2C:
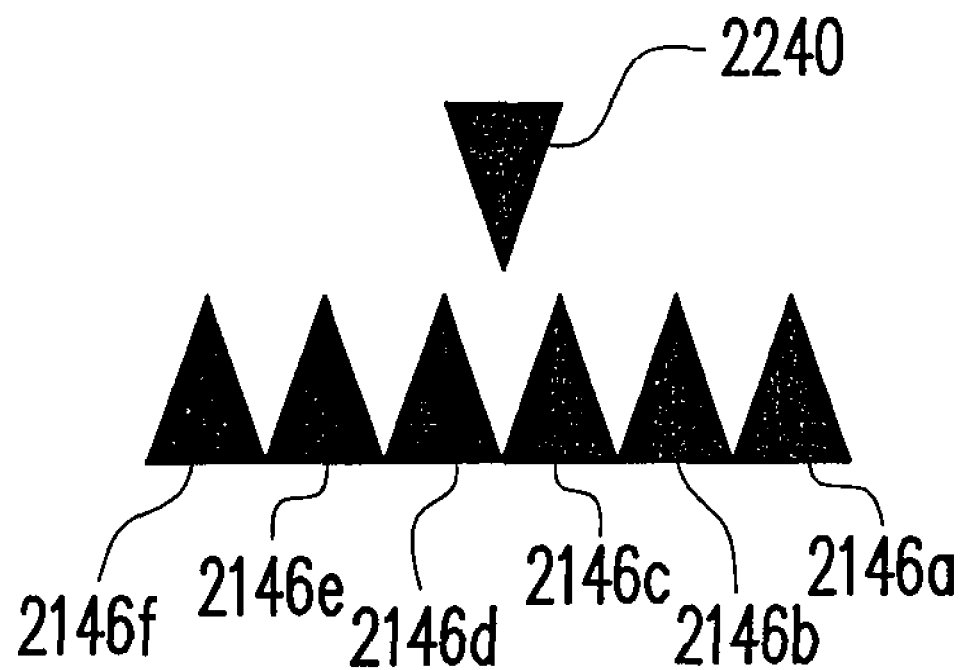
FIG. 2C is a schematic view of the first and second displacement measuring marks in FIG. 2B.

FIG. 2C is a schematic view of first and second displacement measuring marks in FIG. 2B. As shown in FIG. 2C, in the display panel 2000 of this embodiment, the desired situation is that the first leads 2144 and the second leads 2220 are pressed by means of hot press, such that the first leads 2144 and the second leads 2220 are completed bonded, which is called a fine pitch.

However, in the course of pressing the first leads 2144 and the second leads 2220, the first leads 2144 and the second leads 2220 may not be bonded accurately due to the expansion and contraction of material, which generally is considered to be the offset of the second leads 2220.

In order to inspect the offset amount of the second leads 2220, the first displacement measuring mark 2146 is designed to be a plurality of counting scales 2146a, 2146b, 2146c, 2146d, 2146e, and 2146f, and the second displacement measuring mark 2240 is an index mark. In this way, an inspector can conveniently inspect the offset amount of the second leads 2220 according to the alignment of the first displacement measuring mark 2146 and the second displacement measuring mark 2240.

For example, it is assumed that the desired situation is that the second displacement measuring mark 2240 is aligned between the scales 2146c and 2146d. When the second displacement measuring mark 2240 is aligned between the scales 2146e and 2146f, it can be known that during pressing, the expansion of material of the first leads 2144 and the second leads 2220 occurs, and the pressed second leads 2220 are offset from a predetermined position after pressing. Due to the counting scales and the index mark, the inspector may easily inspect the offset of the second leads 2220 by visual estimation. Furthermore, the offset amount of the second leads 2220 may be further inspected easily. In other embodiments, in addition to the method of inspecting whether the second leads 2220 are offset and the offset amount by means of visual estimation of the inspector, the offset can also be inspected by computers or other means.

Furthermore, in order to allow the inspector to recognize conveniently, there are two first displacement measuring marks 2146 and two corresponding second displacement measuring marks 2240 in FIG. 2B. The two first displacement measuring marks 2146 are disposed at both sides of all the first leads 2144, respectively, and the two second displacement measuring marks 2240 are disposed at both sides of all the second leads 2220, respectively. Therefore, the inspector can inspect the offset by using one group of the corresponding first displacement measuring mark 2146 and second displacement measuring mark 2240 conveniently.

In this embodiment, for example, the first displacement measuring mark 2146 is a counting scale, and the second displacement measuring mark 2240 is an index mark. According to the claims and/or embodiments of the specification, people who are skilled in the art can replace the first displacement measuring mark 2146 and the second displacement measuring mark 2240 with other shapes, counting scales, and manners.

It should be noted that, a carrying region 2148 can be further defined in the pad regions 2142 by the aforementioned inspection method, so as to enhance the bonding ratio of the leads of the display panel 2000. In one word, the carrying region 2148 is the region where the second leads 2220 does not offset after the first leads 2144 and the second leads 2220 are pressed. In the carrying region 2148, the bonded first leads 2144 and second leads 2220 have a fine pitch.

After the carrying region 2148 is defined, when manufacturing the display panel 2000, the first leads 2144 can be selectively fabricated in the carrying region 2148 of the pad regions 2142 only, or selectively the first leads 2144 and the second leads 2220 in the carrying region 2148 being pressed only, so as to enhance the bonding ratio of the leads. With the enhancement of the bonding ratio of the leads, the yield of the display panel 2000 is also enhanced, and the work hours and manpower for remanufacturing the display panel 2000 due to defects can be saved.

Furthermore, the numbers and pitches of the first leads 2144 and the corresponding second leads 2220 can be adjusted optionally. As a result, not only the sizes of the substrate 2100 and films for carrying chips 2200 can be reduced, but also the material cost of the leads can be saved.

In view of the above, the display panel, the method of inspecting lead bonding of a display panel, and the lead bonding method of a display panel provided by the present invention at least have the following advantages:

1. According to the displacement measuring marks, the inspector may easily recognize the offset of the bonded leads to determine whether the display panel has defects and must be remanufactured or not, thereby saving the inspection hours and manpower.

2. A carrying region is defined in the pad regions of the substrate by using the offset of the bonded leads, and the bonded leads in the region have a fine pitch.

3. Only the leads in the carrying region are pressed, or only the first leads are fabricated in the carrying region, thereby the bonding ratio of the leads is improved and the work hours and manpower of remanufacturing the display panel are saved.

4. The numbers and pitches of the first leads and the corresponding second leads in the carrying region can be adjusted optionally, thereby not only the sizes of the substrate and films for carrying chips are reduced, but also the material cost of the leads is saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of bonding leads of a display panel, comprising:
    providing a first substrate, wherein a plurality of first leads and at least one first displacement measuring mark located at at least one side of all the first leads are disposed in a plurality of pad regions respectively in a non-display region of the first substrate;
    providing a plurality of films for carrying chips, wherein each film for carrying chips has a plurality of second leads and at least one second displacement measuring mark, the second displacement measuring mark is located at at least one side of all the second leads, and the second displacement measuring mark is corresponding to the first displacement measuring mark;
    pressing the first leads in the pad regions and the corresponding second leads; and
    defining a carrying region in each of the pad regions respectively in the non-display region of the first substrate according to the first displacement measuring mark aiming to the second displacement measuring mark, wherein an alignment offset amount of the first displacement measuring mark and the second displacement measuring mark is zero.

2. The method of bonding leads of a display panel as claimed in claim 1, further comprising providing a plurality of second substrates having the first leads and the first displacement measuring mark disposed in the pad regions in the non-display region of the second substrate, wherein the carrying regions are defined in each of the pad regions in the non-display region of the second substrates, and the first leads are disposed in the carrying regions only.

3. The method of bonding leads of a display panel as claimed in claim 2, further comprising bonding the first leads in the carrying regions with the corresponding second leads of the carrying chips.

4. A display panel, comprising:
    a substrate, having a display region and a non-display region at one side of the display region, wherein the non-display region has a plurality of pad regions, each pad region has a plurality of first leads and at least one first displacement measuring mark, and the first displacement measuring mark is located at at least one side of all the first leads; and
    a plurality of films for carrying chips correspondingly sticking on the substrate, wherein each film for carrying chips has a plurality of second leads and at least one second displacement measuring mark, the second displacement measuring mark is located at at least one side of all the second leads and is corresponding to the first displacement measuring mark; and
    a plurality of carrying regions, defined in the pad regions respectively by the first displacement measuring mark aiming to the second displacement measuring mark, wherein an alignment offset amount between the first displacement measuring mark and the second displacement measuring mark is zero, and the first leads in the carrying regions are bonded with the second leads.

* * * * *